United States Patent [19]

Deri et al.

[11] Patent Number: 5,054,871
[45] Date of Patent: Oct. 8, 1991

[54] SEMICONDUCTOR WAVEGUIDE AND IMPEDANCE-MATCHED DETECTOR

[75] Inventors: Robert J. Deri, Rumson, Monmouth, N.J.; Osamu Wada, Isehara, Japan

[73] Assignees: Bell Communications Research, Inc., Livingston, N.J.; Fujitsu Limited, Kanagawa, Japan

[21] Appl. No.: 547,592

[22] Filed: Jul. 2, 1990

[51] Int. Cl.[5] .............................................. G02B 6/10
[52] U.S. Cl. ...................................... 385/30; 385/130
[58] Field of Search ......................... 350/96.11–96.14, 350/355; 357/85, 88, 30, 58; 372/45, 46, 50

[56] References Cited

U.S. PATENT DOCUMENTS

| | | | |
|---|---|---|---|
| 4,582,390 | 4/1986 | Furuya | 350/96.12 |
| 4,746,181 | 5/1988 | Hayakawa et al. | 350/96.12 |
| 4,749,245 | 6/1988 | Kawatsuki et al. | 350/96.12 |
| 4,755,015 | 7/1988 | Uno et al. | 350/96.12 |
| 4,943,133 | 7/1990 | Deri et al. | 350/96.14 |
| 4,944,838 | 7/1990 | Koch et al. | 350/96.12 X |
| 4,946,243 | 8/1990 | Suzuki et al. | 350/96.14 X |
| 4,970,563 | 11/1990 | Gaylord et al. | 350/96.12 X |
| 4,991,921 | 2/1991 | Suzuki et al. | 350/96.14 X |

OTHER PUBLICATIONS

T. L. Koch et al., "Wavelength Selective Interlayer Directionally Grating-Coupled InP/InGaAsP Waveguide Photodetection", *Applied Physics Letters*, 1987, vol. 51, pp. 1060–1062.

Y. Kokubun et al., "Monolithic Integration of ARROW-Type Demultiplexer and Photodetector", *Proceedings of 14th European Conference on Optical Communications* (ECOC '88), Brighton, U.K., Sept. 1988, pp. 231–234.

T. Baba et al., "Monolithic Integration of an ARROW-Type Demultiplexer and Photodetector in the Shorter Wavelength Region", *Journal of Lightwave Technology*, 1990, vol. 8, pp. 99–104.

*Primary Examiner*—Akm Ullah
*Attorney, Agent, or Firm*—Leonard C. Suchyta; Charles S. Guenzer

[57] ABSTRACT

An impedance-matched semiconductor detector formed on a portion of a waveguide. The waveguiding layer of the waveguide has one refractive index and the light absorbing layer of the detector has another refractive index. An impedance matching layer is formed between the waveguiding layer and the light absorbing layer and has a refractive index intermediate between those of the waveguiding layer and the light absorbing layer.

19 Claims, 11 Drawing Sheets

SEMICONDUCTOR WAVEGUIDE AND IMPEDANCE-MATCHED DETECTOR

FIELD OF THE INVENTION

The present invention relates generally to an optical semiconductor device. It relates particularly to an integrated optical waveguide extending along a substrate and an associated photodetector.

BACKGROUND OF THE INVENTION

In recent years, research and development have been actively continuing on optoelectronic integrated circuit (OEIC) devices for processing optical signals propagating in an optical waveguide. Particularly, attention is being paid to an optical waveguide device integrating an optical waveguide structure formed on a substrate and a photodetector for detecting the light propagating through such a waveguide.

Figure 1:
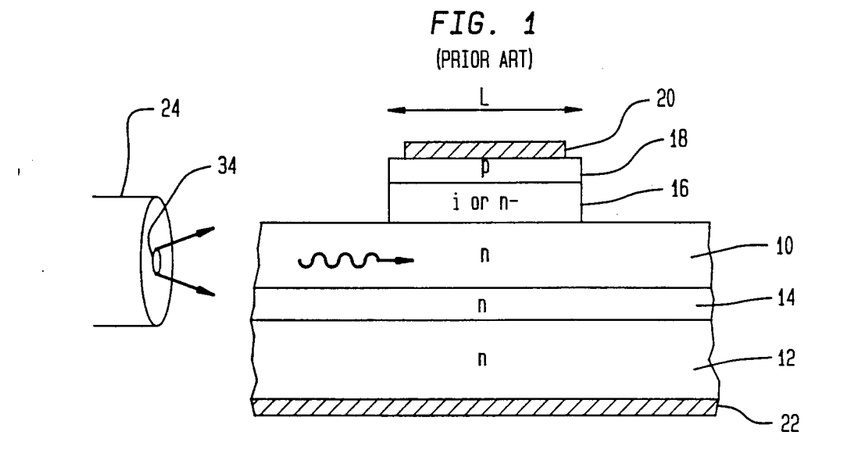
FIG. 1 is a cross-sectional view of an evanescent-coupling type device of the prior art.
Figure 2:
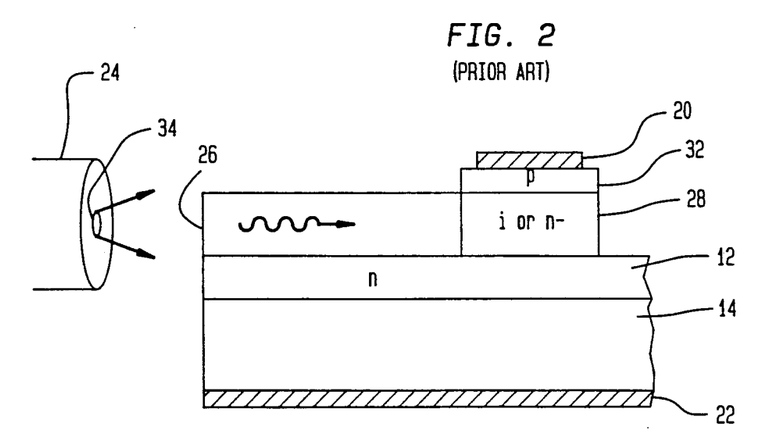
FIG. 2 is a cross-sectional view of a butt-coupling type device of the prior art.

Optical waveguide devices well known in the prior art can be divided into the evanescent-coupling type shown in FIG. 1 and the butt-coupling type shown in FIG. 2.

The evanescent-coupling type optical waveguide shown in FIG. 1 includes an n-type optical waveguide layer 10 formed on an n-type semiconductor substrate 12 with an intermediate n-type buffer layer 14. An intrinsic or $n^-$-type light absorbing layer 16 and an overlying p-type contact layer 18 are formed over a length L of the optical waveguide layer 10. This light absorbing layer 16 and the contact layer 18 form a PIN photodiode structure. Moreover, a pair of opposing electrodes 20 and 22 are formed as shown in the figure and are used to apply a bias voltage to the PIN photodiode.

The incident light from an optical fiber 24 aligned with the optical waveguide device propagates within the optical waveguide layer 10 and is absorbed by the light absorbing layer 16, thereby generating an electrical signal across the electrodes 20 and 22.

This evanescent-coupling type device provides the advantage of forming the optical waveguide 10, the light absorbing layer 16 and the contact layer 18 on the semiconductor substrate 14 through an uninterrupted series of epitaxial growth steps. On the other hand, this device has a disadvantage that the coupling efficiency between a pair of layers is low and therefore the light absorbing efficiency becomes low because the light absorbing layer 16 directly overlies the optical waveguide layer 10.

A butt-coupling type device shown in FIG. 2 also includes an optical waveguide layer 26 and an intrinsic or $n^-$-type light absorbing layer 28 both overlying the n-type buffer layer 12 formed on the semiconductor substrate 14. A p-type contact layer 32 forms a PIN photodiode together with the light absorbing layer 28. A device of this type shows very high light absorbing efficiency because a greater part of the light propagating through the optical waveguide layer 26 is absorbed by the light absorbing layer 28. However, to form the optical waveguide layer 26 and the horizontally adjacent light absorbing layer 28, one of the layers 26 or 28 is formed by epitaxial growth, and that layer 26 or 28 is then partially removed by etching. Then the other layer 28 or 26 must also be formed by epitaxial growth. That is, epitaxial growth is required twice with an intermediate etching step and thereby fabrication becomes correspondingly difficult.

The evanescent-coupling type device shown in FIG. 1 has a more practical structure than the butt-coupling device shown in FIG. 2 because it can be formed with only a single uninterrupted sequence of epitaxial growth. However, as described, this structure has a disadvantage that the light coupling efficiency is low and the light absorbing coefficient is also low. It is thus essential to elongate the length L of the light absorbing layer 16 for improvement of the light absorbing efficiency but thereby the parasitic capacitance of the PIN diode becomes larger, thus degrading high-speed operational characteristics.

One possible method of improving the light absorbing coefficient in the evanescent-coupling device while keeping short the length L of the light absorbing layer 16 is to improve the light coupling efficiency through a reduction of an internal waveguide ray angle (the angle $\Theta$ in FIG. 5, to be described later) by improving the light coupling efficiency. The angle reduction is achieved by making thinner the optical waveguide layer 10 and by making a larger difference of refractive indices between the buffer layer 14 or substrate 12 and the optical waveguide layer 10. However, a thinner optical waveguide layer 10 and a smaller difference of refractive indices between the buffer layer 14 or substrate 12 and the optical waveguide layer 10 are undesirable since the confinement of light in the optical waveguide layer 10 is thereby intensified and the optical coupling efficiency with the optical fiber 24 associated with the device is lowered. Namely, the light confinement region in the optical waveguide layer 10 becomes thereby much narrower in comparison with a core region 34 of the optical fiber 24. Also, the difficulty of input coupling by other means, such as lenses, is thereby rendered more difficult.

A thinner light absorbing layer 16 is a typical method of improving the light absorbing efficiency while maintaining a short length L for the light absorbing layer 16. But an excessively thin light absorbing layer 16 results in a larger parasitic capacitance of the PIN photodiode, thus degrading high-speed operational characteristics.

Koch et al have disclosed a type of an evanescent-coupling type of device having an anti-resonant reflecting optical waveguide (ARROW) in a technical article entitled "Wavelength selective interlayer directionally grating-coupled InP/InGaAsP waveguide photodetection" appearing in Applied Physics Letters, volume 51, 1987 at pages 1060–1062. As is shown in their FIG. 1, the light field distribution is usually confined to the waveguide layer by a cladding layer of anti-resonant thickness. However, the cladding layer is patterned to form a grating adjacent a semiconductor photodetector layer to thereby couple or scatter the otherwise guided light into the photodetector layer. The disadvantages of the Koch design is the necessity for regrowth over the grating and the very high wavelength sensitivity of the grating.

Figure 3:
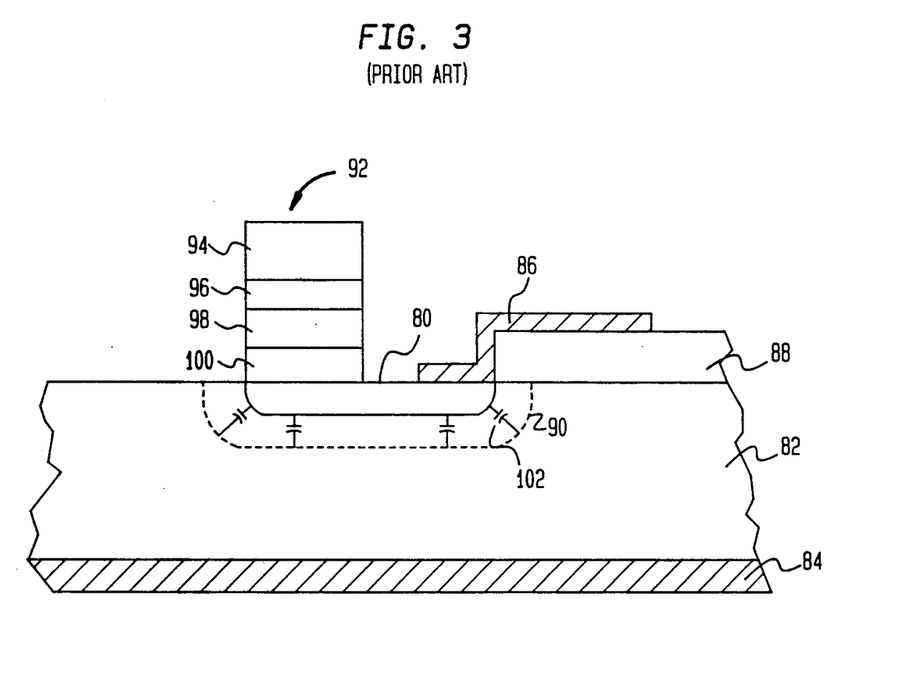
FIG. 3 is a cross-sectional view of an anti-resonant reflecting type device of the prior art.

Kokubun et al have disclosed a related ARROW photodetector in a technical article entitled "Monolithic Integration of ARROW-type Demultiplexer and Photodetector" appearing in Proceedings of 14th European Conference on Optical Communications (ECOC '88), Brighton UK, September 1988 at pages 231–234. The Kokubun structure is illustrated in FIG. 3. An n-type region 80 is diffused into a p-type silicon substrate 82. A lower aluminum electrode 84 contacts the p-type substrate 82 and an upper aluminum electrode 86 contacts the n-type diffusion region 80 but is isolated from the substrate 82 by insulating layer 88. When the p-n junction between the n-type region 80 and the p-type substrate 82 is reversed biased, it forms a depletion region with a depletion edge 90, thereby forming an optical detector for an overlying waveguide structure 92. The waveguide structure includes a $SiO_2$ waveguide core layer 94, an antiresonant cladding layer 96 adjacent the core layer 94, and a lower cladding layer 98. Further, an anti-reflection layer 100 is placed between the lower cladding layer 98 and the n-type diffusion region 80. The anti-reflection layer 100 has an index of refraction intermediate between those of the lower cladding layer 100 and the silicon n-type region 80. However, the thickness of Kokubun's lowest cladding layer 98 (~2 μm) puts the photodetector beyond the tail of the optical intensity distribution of the evanescent wave in the waveguide layer 94. Therefore, Kokubun introduced a leakage structure in the waveguide structure 92 overlying the photodetector so as to couple the propagating light toward the photodetector. This work was later described in more detail by T. Baba et al in a technical article entitled "Monolithic Integration of an ARROW-Type Demultiplexer and Photodetector in the Shorter Wavelength Region" appearing in Journal of Lightwave Technology, volume 8, 1990, at pages 99–104. A disadvantage of this approach is that a complex buried structure is needed to define both the photodetector and the leakage structure. Furthermore, the light leakage is very wavelength sensitive. Also, the upper electrode 86 is formed over a side extension of the n-type diffusion region 80. The extra extended area of the diffused region produces an extra amount of parasitic capacitance 102 across the depletion region. The higher parasitic capacitance 102 increases the total photodetector capacitance and prevents high-speed operation of the photodetector.

SUMMARY OF THE INVENTION

It is therefore an object of the present invention to provide a structure ensuring high light absorbing coupling efficiency between the optical waveguide layer and the light absorbing layer in an evanescent-coupling device.

It is further object of the invention to provide such a waveguide and detector device by a practical uninterrupted epitaxial growth process.

It is a yet further object of the invention to provide such a device in which the refractive index and thickness of the optical waveguide layer and the thickness and length of the light absorbing layer may be independently set to optimum values so that the coupling efficiency with an optical fiber can be optimized and high-speed operational characteristics of the PIN photodiode can be realized.

The present invention provides an optical waveguide and associated photodetector comprising an optical waveguide layer for propagating a beam of light and extending on a substrate and having a first refractive index. A light absorbing layer provides an electrical signal by absorbing the light beam propagating in the optical waveguide layer. The light absorbing layer is formed over a part of the optical waveguide layer and has a second refractive index different from the first refractive index. An impedance matching layer is formed between the waveguide layer and the light absorbing layer and has a third refractive index between the first and second refractive indices.

DETAILED DESCRIPTION

Figure 4:
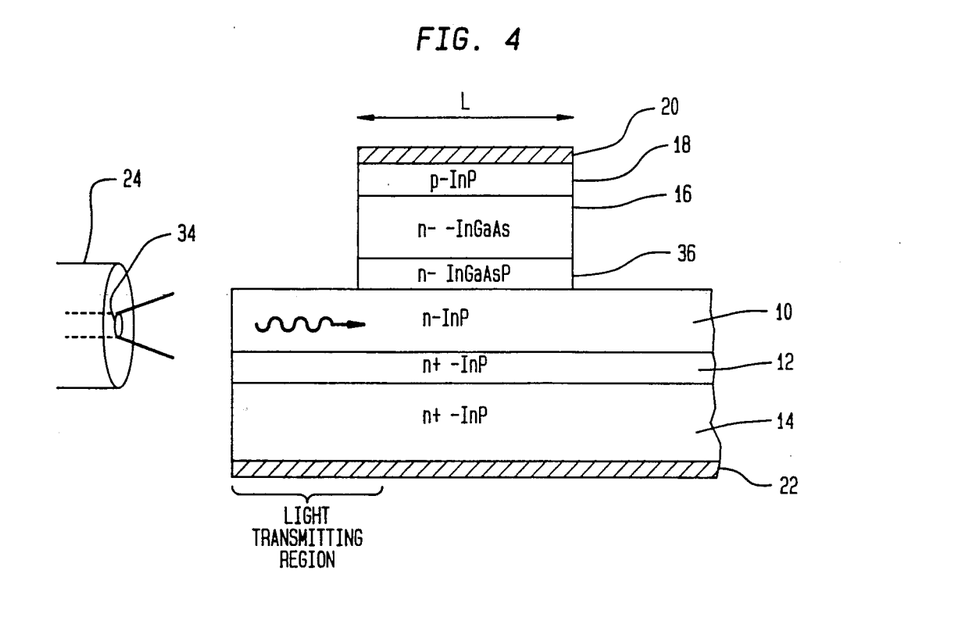
FIG. 4 is a cross-sectional view of an impedance matched detector of the present invention.
Figure 5:
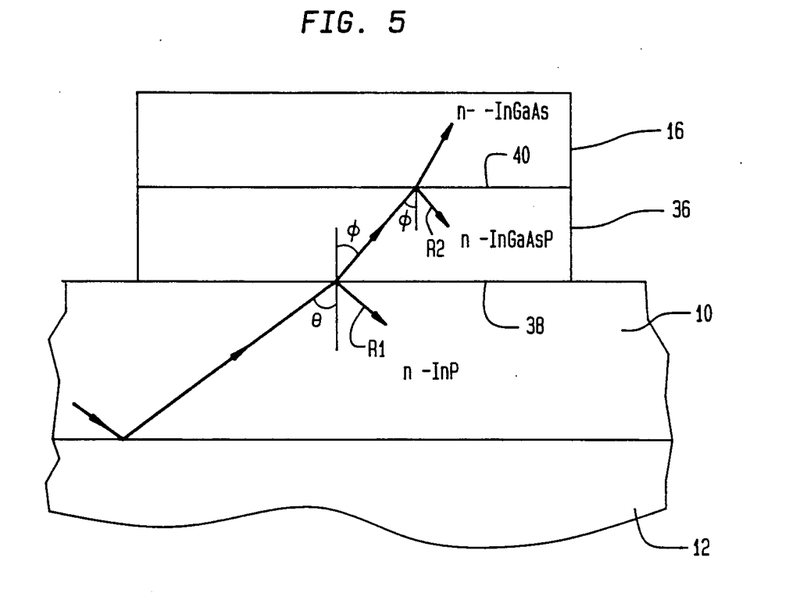
FIG. 5 is a cross-sectional view of the present invention, illustrating the refraction and reflection of light rays.

FIG. 4 is a cross-sectional view of the impedance matched detector of the present invention and FIG. 5 is a diagram for explaining its principle of operation. The elements similar to these of the prior art shown in FIG. 1 are designated by like reference numerals.

As shown in FIG. 4, the optical waveguide layer 10 is formed over the buffer layer 12, itself formed over the semiconductor substrate 14. The optical waveguide layer 10 consists of InP of a lower n-type doping concentration n than the substrate 14 consisting of InP of a higher doping concentration $n^+$. The buffer layer 12 consists of InP of the same higher doping concentration $n^+$. Moreover, in accordance with our invention, an impedance matching layer 36, consisting, for example, of InGaAsP is formed in a predetermined composition ratio and thickness over a partial length of the optical waveguide layer 10. Furthermore, the light absorbing layer 16 consisting of intrinsic n-type InGaAs of lower concentration $n^-$, the contact layer 18 consisting of p-type InP, and the electrode 20 are formed on the full portion L of the impedance matching layer 36.

The buffer layer 12 and substrate 14 have low refractive indices since these layers include higher impurity concentration than the optical waveguide layer 10 and therefore function as a cladding layer or medium for the optical waveguide layer 10. On the other hand, the air 37 facing the exposed optical waveguide layer 10 also functions as a cladding layer or medium since it has a low refractive index (n=1). The thicknesses of the combination of the buffer layer 12 and the substrate 14 and of the air are thicker than the corresponding tail of the optical intensity distribution therein. Therefore, the left side region in the cross sectional view of FIG. 4 functions as a light transmitting region.

The impedance matching layer 36 is a quaternary material and has a refractive index intermediate between those of the optical waveguide layer 10 and the light absorbing layer 16. Thereby, the impedance matching layer 36 improves transfer of light into the absorbing layer 16 by virtue of the fact that the refractive index of the impedance matching layer 36 has a value intermediate between those of the optical waveguide layer 10 and the light absorbing layer 16, as described previously.

The refractive index and thickness of the impedance matching layer 30, in accordance with our invention, are selected both for enhancing the coupling to the absorbing layer 16 for reasons as described as follows in more detail.

To satisfy a first condition, the refractive index $n_{wg}$ and thickness $t_{wg}$ of the optical waveguide layer 10 are selected so that the coupling efficiency with the core 34 of the optical fiber 24 is optimized. Meanwhile, the thickness $t_{ab}$, length L and refractive index $n_{ab}$ of the light absorbing layer 16 are selected so that the parasitic capacitance of the PIN photodiode is reduced and high-speed operation can be realized.

Next, the thickness $t_{im}$ and refractive index $n_{im}$ of the impedance matching layer 20 are selected, from the relationship among $n_{wg}$, $t_{wg}$, $n_{ab}$, $t_{ab}$ mentioned above, so that it functions similarly to an anti-reflection coating.

For this purpose, an approximate procedure can be used. First, as shown in FIG. 5, the reflectance $R_1$ of light rays propagating through the optical waveguide layer 10 that are reflected at a boundary 38 between the waveguide layer 10 and the impedance matching layer 20 is set to be nearly equal in magnitude to the reflectance $R_2$ of light rays reflected at a boundary 40 between the impedance matching layer 36 and the light absorbing layer 16. Namely, $$|R_1| \approx |R_2|. \tag{1}$$

From this formula, in principle, the refractive index $n_{im}$ of the impedance matching layer can be obtained from the incident ray angle $\Theta$, the refractive index $n_{wg}$ of the optical waveguide layer 10 and the refractive index $n_{ab}$ of the light absorbing layer 16.

Namely, the incident ray angle $\Theta$ at the lower boundary 38 is uniquely determined depending on the structure ($n_{wg}$ and $t_{wg}$) of the optical waveguide layer 10 and the incident angle $\Phi$ at the upper boundary 40 can also be obtained by Snell's law. The reflection intensity at the lower boundary 38 can be obtained from the following relationship.

$$|R_1| = \frac{n_{wg}\cos\Theta - \sqrt{n_{im}^2 - n_{wg}^2\sin^2\Theta}}{n_{wg}\cos\Theta + \sqrt{n_{im}^2 - n_{wg}^2\sin^2\Theta}} \tag{2}$$

Moreover, the reflection intensity $|R_2|$ at the upper boundary 40 can also be obtained in the same way.

Figure 6:
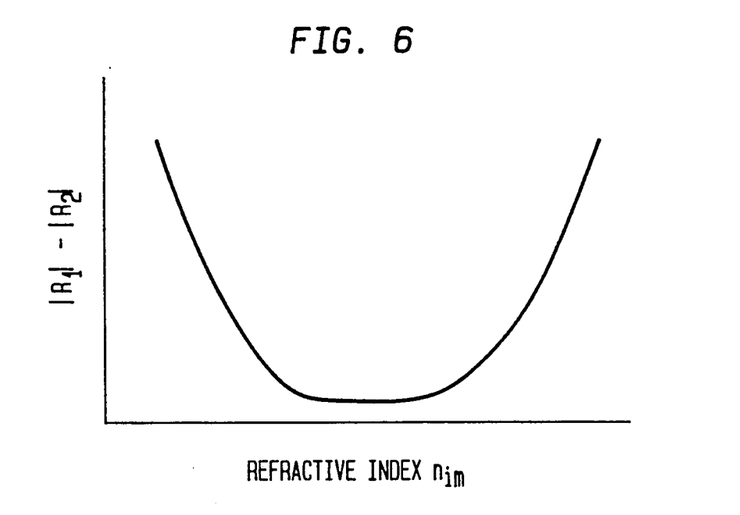
FIG. 6 is a diagram for explaining the relationship of reflectivity difference and refractive index.

From the above relationship, in principle, the refractive index $n_{im}$ of the impedance matching layer 36 can be obtained from the incident ray angle $\Theta$, the refractive index $n_{wg}$ of the optical waveguide layer 10 and the refractive index $n_{ab}$ of the light absorbing layer 16 on the basis of equation (2). However, in practice, a fixed solution cannot be analytically obtained. But, since the relationship between the reflectivity difference $|R_1| - |R_2|$ and the refractive index $n_{im}$ of the impedance matching layer 36 is as shown in FIG. 6, it is enough to obtain $n_{im}$ of the region where $|R_1| - |R_2| \approx 0$.

To satisfy a second condition, respective light components reflected at the reflection boundaries 38 and 40 cancel each other when the phase at the lower boundary 38 is inverted. Thus, the light is not reflected at all. The condition of such null reflection is expressed by the following equation.

$$4n_{im}t_{im}\cos\Phi = (2m+1)\lambda \tag{3}$$

In equation (3), m is an integer. Since $n_{im}$ is already obtainable from equation (1), $t_{im}$ can be obtained from equation (3). The method for obtaining the refractive index $n_{im}$ and the thickness $t_{im}$ of the impedance matching layer 36 is a generally known approach in the field of thin film optics.

As an alternative to the above approximation, a more exact calculation may be performed in the case of the structure of FIGS. 4 and 5. That is, the light absorption coefficient can be calculated using computer simulations. For instance, it is also possible to obtain the refractive index $n_{im}$ and thickness $t_{im}$ of the impedance matching layer 36 which maximizes the light absorption coefficient by utilizing the calculational method fully known by one skilled in this art and as described by Vinchant et al in "Photodetectors monolithically integrated with optical waveguides: theoretical and experimental study of absorbing layer effects," IEE Proceedings, volume 136, 1989 at pages 72-75, and by Vinchant et al in "Effects of Absorbing layers on the propagation constants: A four layer model on desktop-computer applied to photodetectors monolithically integrated with optical waveguides," Optics Communications, volume 67, 1988 at pages 266-270.

EMBODIMENT 1

Figure 7:
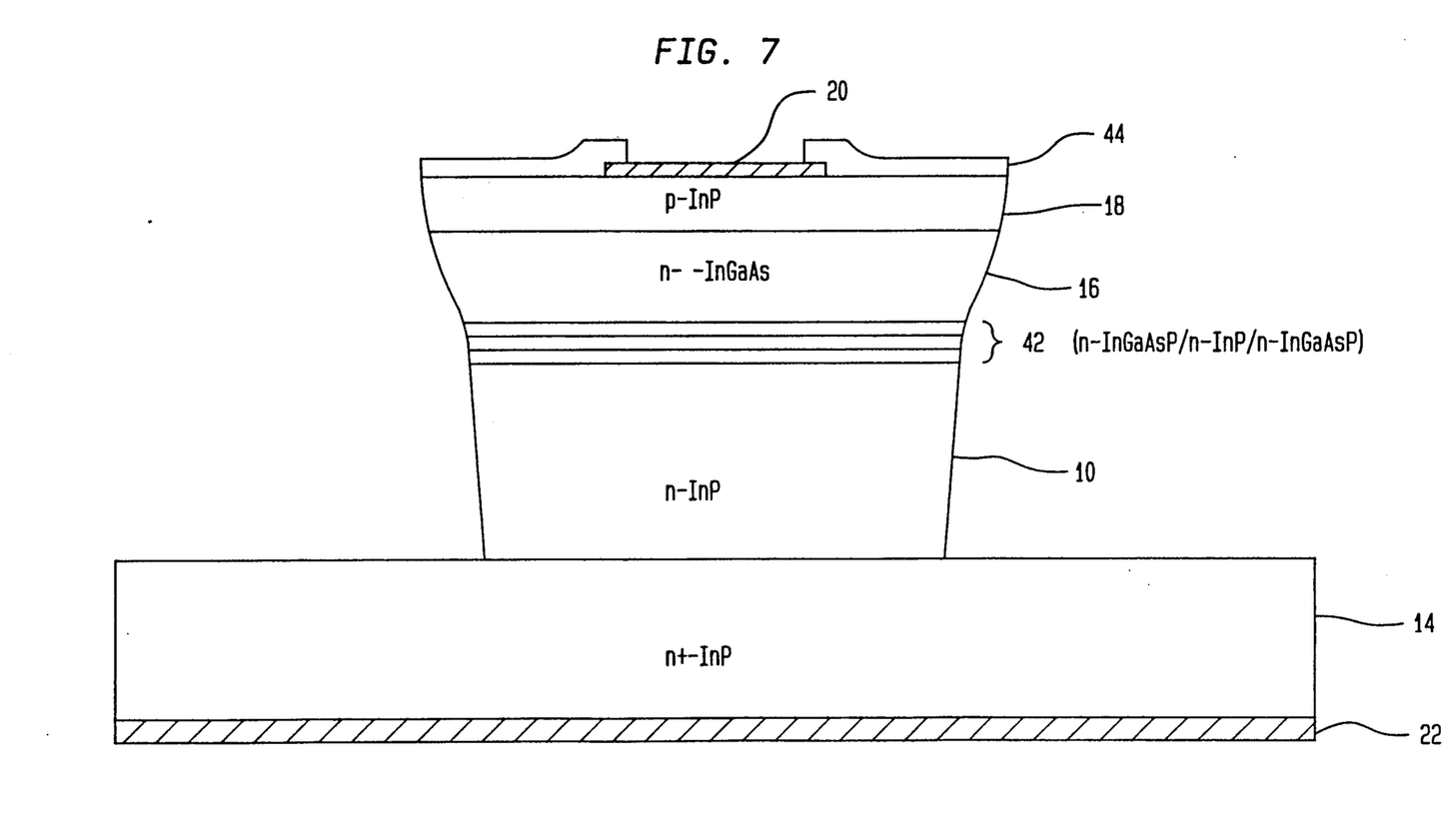
FIG. 7 is a cross-sectional view of a first embodiment of the present invention taken along section line A—A of FIG. 8.
Figure 8:
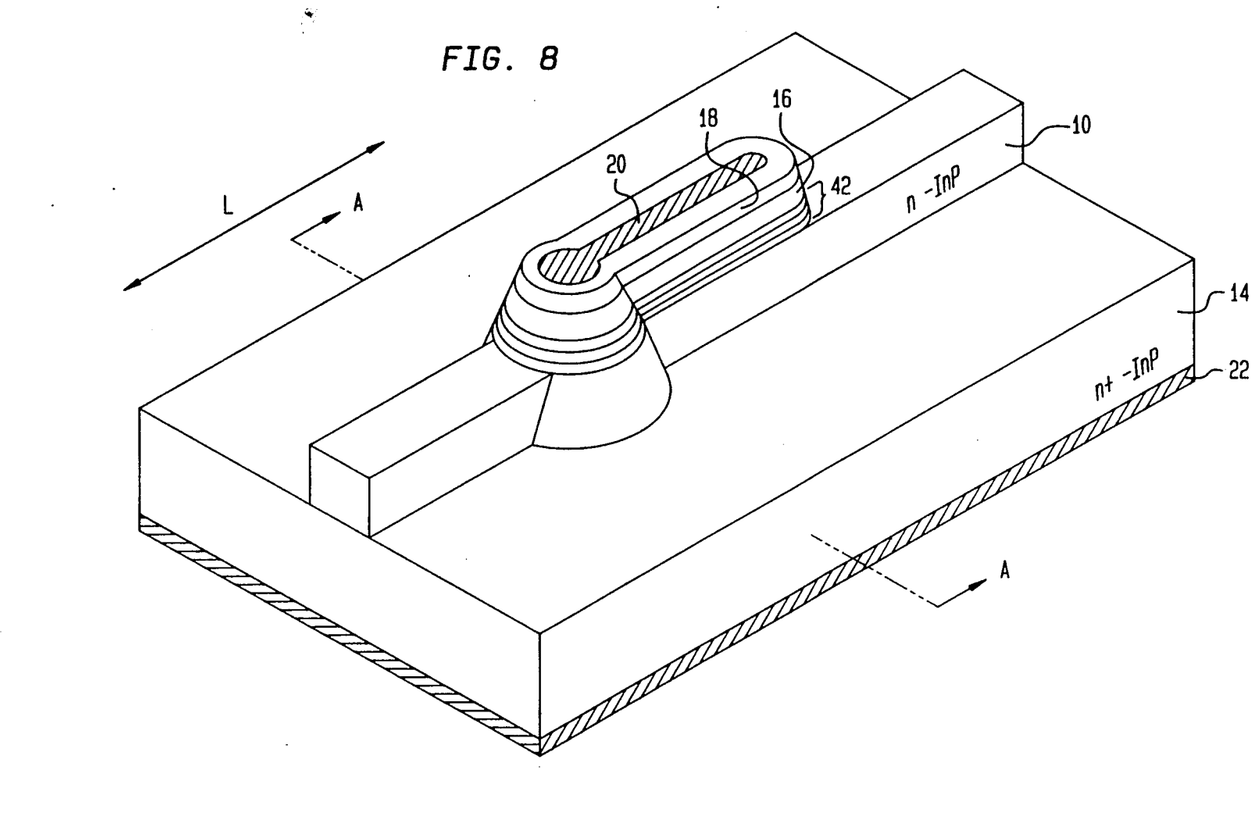
FIG. 8 is a perspective view of the first embodiment of the present invention.

A cross-sectional view and a perspective view of a first embodiment of the present invention are respectively shown in FIGS. 7 and 8. FIG. 7 is a cross-sectional view along the line A—A in FIG. 8.

In this embodiment, the optical waveguide layer 10 of n-type InP of a certain concentration extends on the semiconductor substrate 14 of n+-type InP of dopant concentration higher than that of the waveguide layer 12. An impedance matching layer 42 has a three-layer structure of n⁻-InGaAsP/n⁻-InP/n⁻-InGaAsP which is located between the light absorbing layer 16 and the optical waveguide layer 10. A cover film 44 covers the contact layer 18 except in areas of the p-side electrode 20. The p-n junction of the photodetector is formed along the entire length of the uppermost layer 18. The whole structure involving the waveguide layer 10, the impedance matching layers 42, and the photoabsorption layer 16 are sandwiched between the top and bottom electrodes 20 and 22 so that no excess parasitic capacitance is introduced in the structure.

This embodiment differs from the principle embodiment shown previously in FIG. 4 in that the buffer layer 12 is omitted and the impedance matching layer 42 has a three-layer structure. The tri-level structure of the impedance matching layer 42 is used for precise control of the refactive index. Since the buffer layer 12 is not provided, the substrate 14 functions at the lower cladding layer of the optical waveguide layer 10. Moreover, the optimum refractive index and thickness can be realized by using the three-layer structure for the impedance matching layer 42. The fabrication data of all layers are as follows.

| Semiconductor Substrate 14: | |
|---|---|
| Material: | $n^+$-InP |
| Concentration: | $2 \times 10^{18}$/cm$^3$ |
| Optical waveguide layer 10: | |
| Material: | $n^-$-InP |
| Concentration: | $5 \times 10^{16}$/cm$^3$ |
| Thickness: | 3.5 μm |
| Width: | 6 to 12 μm |
| Impedance matching layer 42: | |
| Material: | $n^-$-InGaAsP/$n^-$-InP/$n^-$-InGaAsP (lattice matched to InP) |
| Thickness: | 150 nm/250 nm/150 nm |
| Band gap wavelength of InGaAsP: | 1.13 μm |
| Refractive index of InGaAsP: | 3.317 |
| Light absorbing layer 16: | |
| Material: | $n^-$-InGaAs (lattice matched to InP) |
| Thickness: | 1.7 μm |
| Concentration: | Substantially undoped |
| Contact layer 18: | |
| Material: | $p^-$-InP |
| Concentration: | Zn doped, $2 \times 10^{18}$/cm$^3$ |
| p-side electrode 20: | |
| Material: | Au/Zn/Au |
| n-side electrode 22: | |
| Material: | Au/AuGe |

As shown in FIG. 8, the impedance matching layer 42 is provided on a partial region of the optical waveguide layer 10. In this embodiment, the length L of the impedance matching layer 42 is set as short as about 100 μm.

Moreover, when the refraction index $n_{wg}$ is 3.17, the thickness $t_{wg}$ of the light absorbing layer 16 is 1.7 μm, the refractive index $n_{ab}$ is $(3.535 + j0.083)$ and the length L is 100 μm, then the refractive index $n_{im}$ of the impedance matching layer 42 is 3.22 and its thickness $t_{im}$ is 550 nm.

Figure 9:
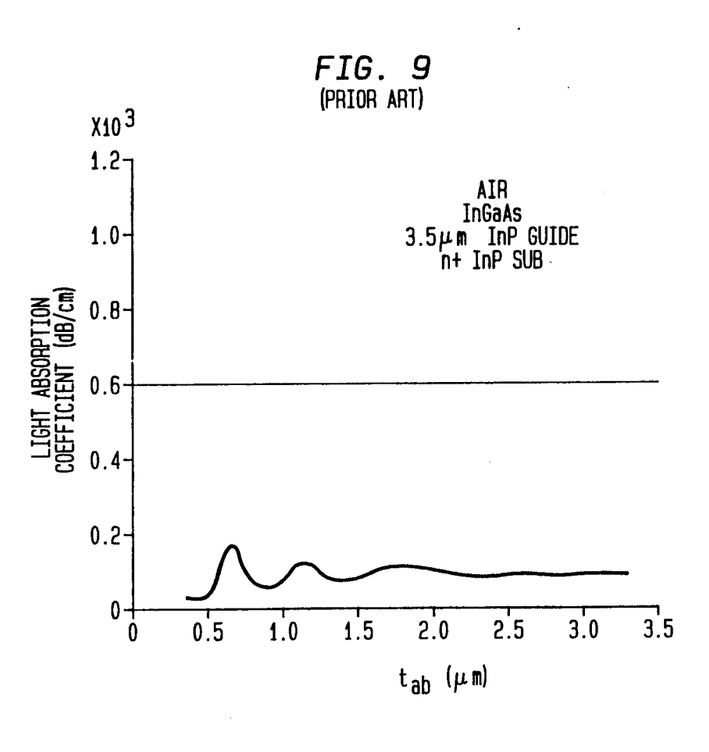
FIGS. 9 and 10 are graphs relating light absorption and thickness of the light absorbing layer for the prior art and for the first embodiment of the present invention respectively.
Figure 10:
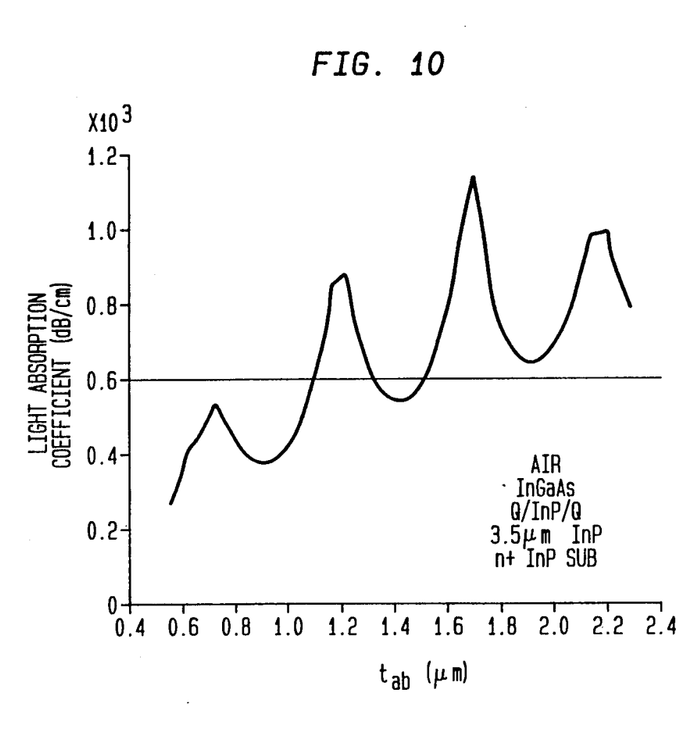

FIGS. 9 and 10 are graphs showing the relationship between the light absorption coefficient and the thickness t of the light absorbing layer 16 in this embodiment and in the prior art. FIG. 9 shows the light absorption coefficient of the prior art structure where the impedance matching layer is not provided, while FIG. 10 shows the light absorption coefficient of the structure of the first embodiment including the impedance matching layer.

As is obvious from FIGS. 9 and 10, when the thickness of the light absorbing layer 16 is very thin, the light absorption coefficient shows a small peak for the prior art structure in which the impedance matching layer is not provided. But, in case the impedance matching layer 42 is provided, the light absorption coefficient is considerably increased even when the light absorbing layer 42 becomes thick. In the case of this embodiment, the thickness of the light absorbing layer 42 is set to about 1.7 μm and thereby a very high light absorption coefficient is achieved as shown in FIG. 10.

Figure 11:
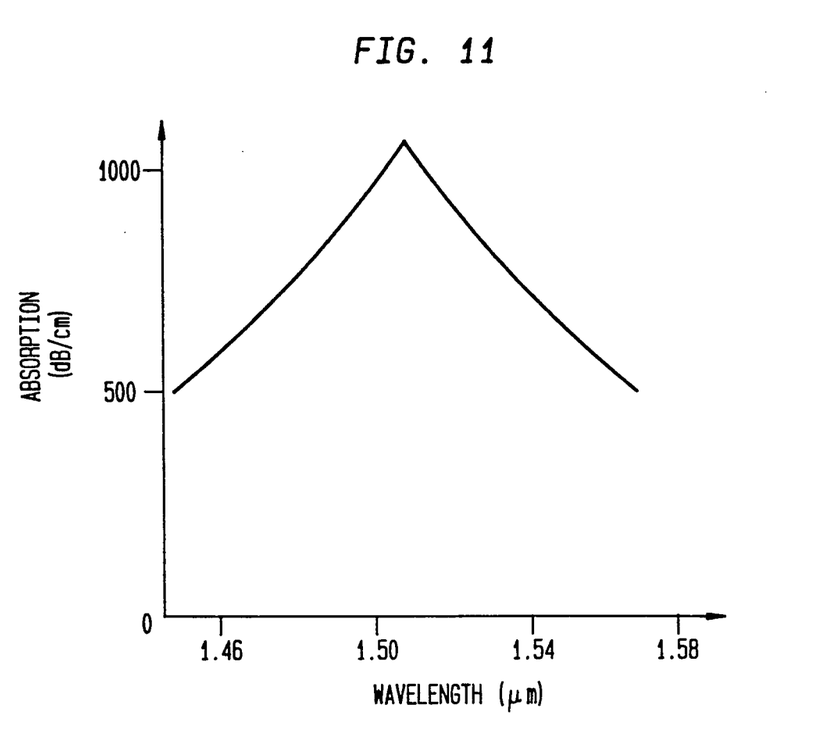
FIG. 11 is a graph relating light absorption and wavelength for the first embodiment of the present invention.

FIG. 11 is a graph showing the theoretical relationship between the light wavelength and the light absorption coefficient of the light propagating in the structure of the first embodiment explained above.

As is obvious from FIG. 11, the light absorption coefficient changes depending on the wavelength of propagating light. However, even when the wavelength is displaced ±40 nm (0.04 μm) from the peak value of 1.52 μm, the light absorption coefficient changes only about 35%. That is, the actual wavelength bandwidth having a high light absorption coefficient is 80 nm, which is a sufficient value for practical use.

EMBODIMENT 2

Figure 12:
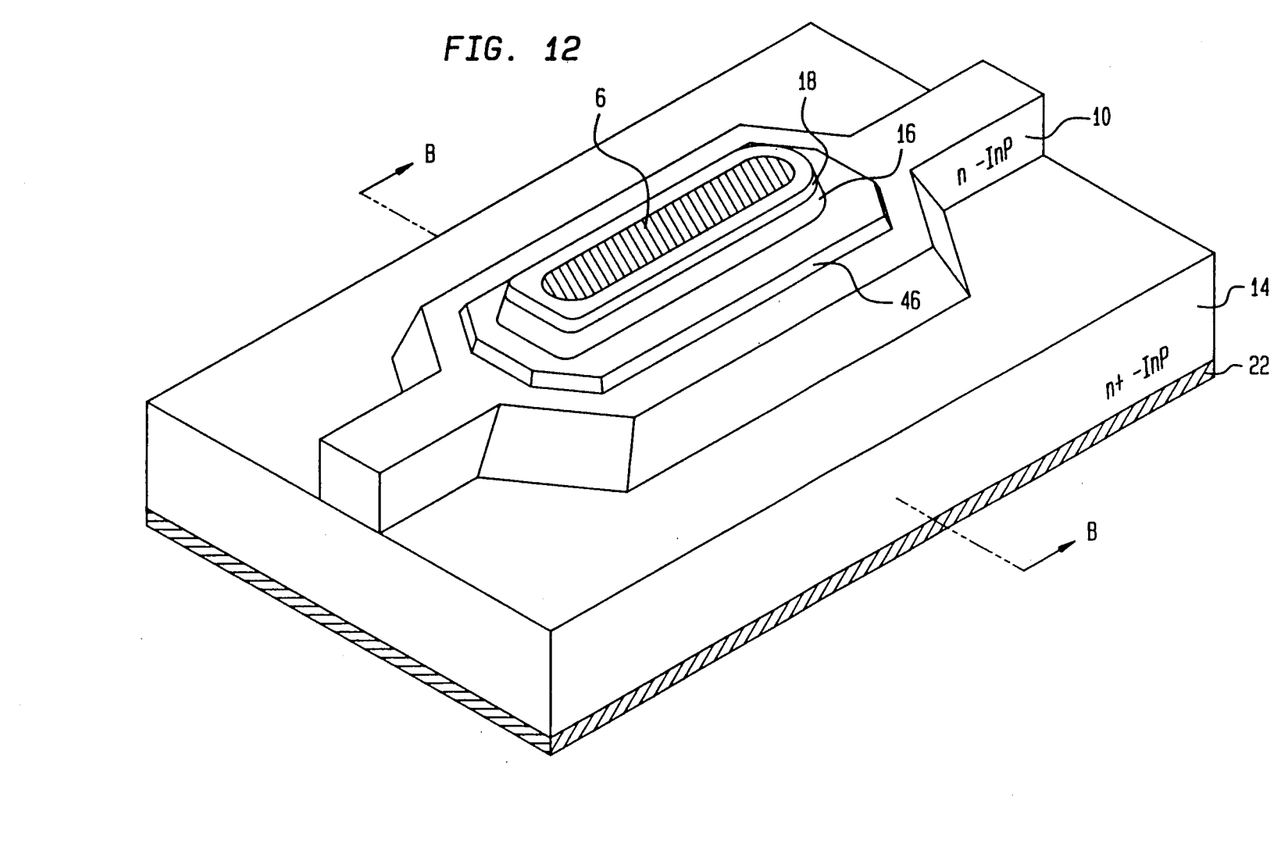
FIG. 12 is a perspective view of a second embodiment of the present invention.

FIG. 12 is a perspective view of a second embodiment of the present invention. This embodiment differs from that of FIG. 8 in that an impedance matching layer 46 having a three-layer structure of $n^-$-InGaAsP/$n^-$-InP/$n^-$-InGaAsP is narrower than the width of the optical waveguide layer 10 but is wider than the width of the light absorbing layer 16 and of the contact layer 18. The other structural details are the same. The InGaAsP/InP/InGaAsP structure is used for index control.

The staircase structure as described above is employed for the following reasons. The structure of, for example, the first embodiment of FIG. 8 has commonly aligned side edges for the optical waveguide layer 10, impedance matching layer 42 and the light absorbing layer 16. If this structure is formed by the etching method utilizing a single mask, an etchant which can etch the quaternary material must be used. However, the etching rate of the quaternary material InGaAsP of the impedance matching layer 42 is smaller than that of the other two-component and three-component materials. Thereby, the 3-component material (InGaAs) is significantly side-etched while the 4-component or quaternary material is being etched.

Figure 13:
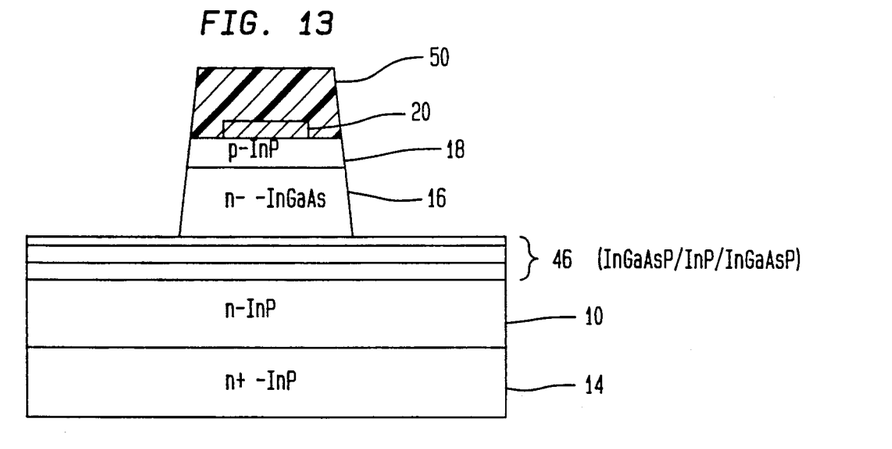
FIGS. 13, 14, and 15 are cross-sectional views of the manufacturing process of the second embodiment of the present invention taken along section line B—B of FIG. 12.
Figure 14:
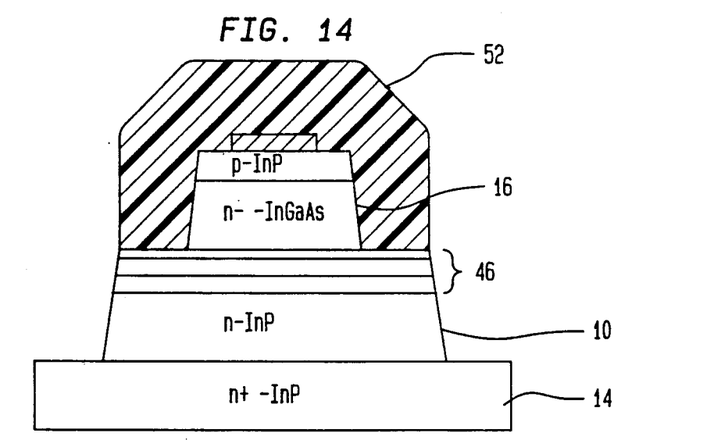
Figure 15:
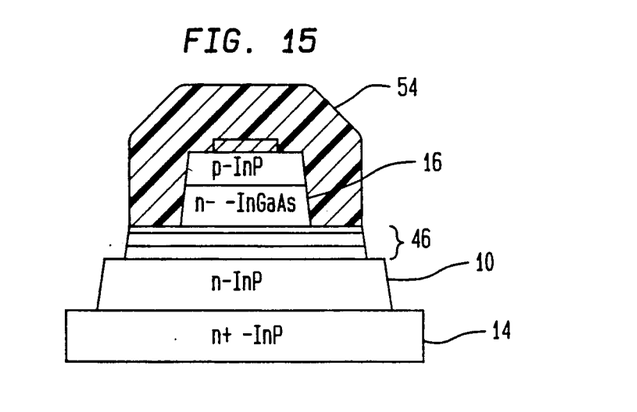

However, in the second embodiment of FIG. 12, the side etching of the 4-component material is prevented by covering the light absorbing layer 16 with a resist mask during the etching of the quaternary material of the impedance matching layer 46 through employment of the etching process explained with respect to FIGS. 13 through 15.

FIGS. 13 through 15 show cross-sectional views of fabrication steps of the second embodiment of FIG. 12, the cross-sectional views being taken along the line B—B of FIG. 12.

As illustrated in FIG. 13, epitaxial growth on the $n^+$-type InP substrate 14 forms in succession the n-type InP optical waveguide layer 10, the impedance matching layer 46 having the three-layer structure of $n^-$-InGaAsP/$n^-$-InP/$n^-$-InGaAsP, the non-doped InGaAs light absorbing layer 16 and the Zn-doped p-type InP contact layer 18. The p-side electrode 20 having the composition of Au/Zn/Au is then formed in the predetermined shape illustrated in FIG. 12. Thereafter, a first resist mask film 50 is formed and patterned. The contact layer 18 and the light absorbing layer 16 are etched using two etchants and the first resist mask film 50. As a result, the contact layer 18 and the light absorbing layer 16 have the mesa structure shown in FIG. 12.

The etchants used in this case are as follows.

| Contact layer 18: | $HCl:H_3PO_4$ or $HCl:H_2O$ |
| Light absorbing layer 16: | $H_3PO_4:H_2O_2$ or $H_2SO_4:H_2O_2:H_2O$ |

Next, as illustrated in FIG. 14, a second resist mask film 52 is formed and patterned in a shape of the optical waveguide layer 10 extending in the longitudinal direction of the substrate 14. The impedance matching layer 46 of a quaternary material is etched by a solution of $Br_2:CH_3OH$ or $HCl:CH_3COOH:H_2O_2$, while the optical waveguide layer 10 is etched by a solution of $HCl:H_3PO_4$ or $HCl:H_2O$. Thereby, the shape of the optical waveguide layer 10 shown in FIG. 12 can be formed. In this case, since the light absorbing layer 16 is covered with the second resist mask film 52, it is not side etched.

Next, as illustrated in FIG. 15, a third resist mask film 54 having a width intermediate between those of the first and second resist mask films 50 and 52 is formed and patterned in the shape of the impedance matching layer 46 of FIG. 12. The impedance matching layer 16 includes a quaternary material and is etched utilizing a solution of $Br_2:CH_3OH$ or $HCl:CH_3COOH:H_2O_2$. As a result, the structure of FIG. 12 can be completed. In this process, since the light absorbing layer 16 is covered with the third resist mask 54, the light absorbing layer 16 is never side etched.

As described, the structure of the second example is superior to that of the first example for reasons of manufacturability.

EMBODIMENT 3

Figure 16:
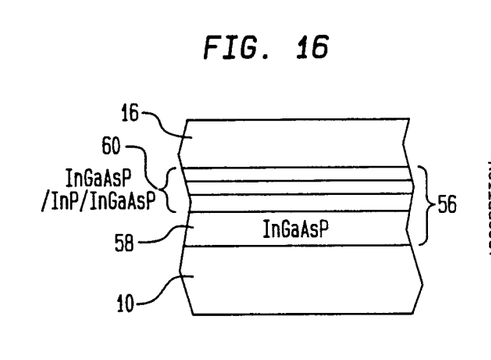
FIG. 16 is a cross-sectional view of a third embodiment of the present invention.
Figure 17:
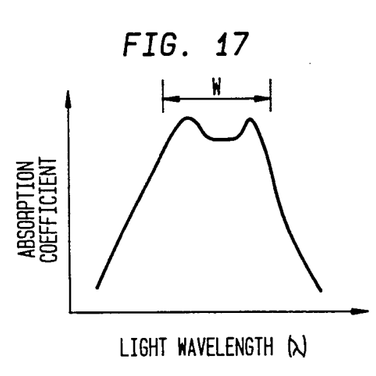
FIG. 17 is a graph relating light absorption and wavelength for the third embodiment of the present invention.

FIG. 16 is a diagram illustrative of a cross-section of a third embodiment of the present invention and FIG. 17 is a graph showing the relationship between absorption coefficient and wavelength of light.

In this third embodiment, an impedance matching layer 56 has a structure consisting of a lower layer 58 and an upper layer 60. Specifically, the upper layer 60 has a three-layer structure of $n^-$-InGaAsP/$n^-$-InP/$n^-$-InGaAsP, like the first and second embodiments, while the lower layer 58 has the composition of $n^-$-InGaAsP which is different in the percentage of As from the quaternary material of the upper layer 60. The lower layer 58 has a thickness of about 0.2-1.0 μm. In this embodiment, the refractive index of the upper layer 60 is 3.2-3.4 and that of the lower layer 58 is likewise in the range 3.2-3.4, but these refractive indices are selected to be different.

In the case that the impedance matching layer 56 is formed of a pair of layers 58 and 60 having different refractive indices, the bandwidth W, as illustrated in the graph of FIG. 17, of the optical wavelength having a high absorption coefficient becomes wider than that of FIG. 11 for the first embodiment. Namely, the peaks of a pair of absorption coefficients approximately appear when the impedance matching layer is formed in the two-layer structure using different refractive indices. In the case of this embodiment, the bandwidth W is about 250 nm.

EMBODIMENT 4

Figure 18:
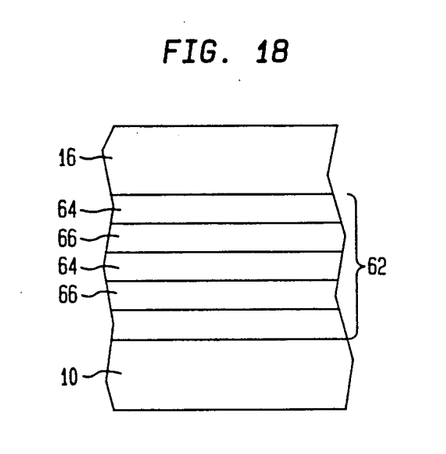
FIG. 18 is a cross-sectional view of a fourth embodiment of the present invention.
Figure 19:
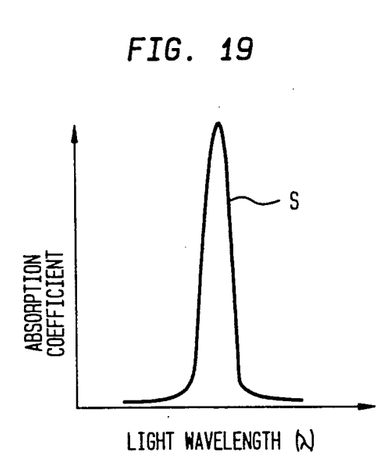
FIG. 19 is a graph relating light absorption and wavelength for the fourth embodiment of the present invention.

FIG. 18 is a partial cross-sectional view of the fourth embodiment of the present invention and FIG. 19 is a graph showing the relationship between the absorption coefficient and wavelength of light λ.

In this fourth embodiment, an impedance matching layer 62 is given the periodic structure of two kinds of films 64 and 66 of different composition. Specifically, two different types of n-type InGaAsP, both having the refractive indices of 3.1∼3.4 but of different values and having thicknesses of about 0.1∼0.3 μm, are repetitively formed.

With this structure, as shown in FIG. 19, a gradient S of the absorption coefficient near its peak can be set more sharply than that in FIG. 11. Such characteristics achieve selective detection with a PIN photodiode of light having a particular wavelength in such a case that light of various wavelengths is propagated.

The n-side electrode 22 provided in the rear surface of the substrate in the first and second embodiment can also be provided on the surface of impedance matching layer and optical waveguide layer. In addition, the refractive indices of the light absorbing layer and impedance matching layers may be varied by changing the voltage to be applied to the pair of electrodes 20 and 22 and thereby the wavelength which gives the maximum optical coupling coefficient can be controlled. Moreover, the change of refractive indices can be increased by employing the single quantum well structure or a multiple quantum well structure for the light absorbing layer and for the impedance matching layer.

The embodiments illustrated in cross section in FIGS. 7, 16 and 18 include impedance matching layers formed from multiple discrete layers, each of these layers being uniform. On the other hand, an impedance matching layer may have a composition which is continuously graded, thereby providing a continuous gradation of the refractive index. For example, the composition of the impedance matching layer may be continuously varied spatially between the compositions of the waveguide layer 10 and the light absorbing layer 16 so that its refractive index is linearly graded between the refractive indices of those layers 10 and 16.

Referring again to FIG. 4, as light propagates along the waveguide layer 10 beneath the impedance matching layer 36, a finite distance is required before the light is completely coupled into the impedance matching layer 36. Only thereafter is the light then coupled into the light absorbing layer 16. Nonetheless in the structure of FIG. 4, the impedance matching layer 36 and the light absorbing layer 16 have the same length. As a result the light absorbing layer 16 is longer than is necessary for efficient light absorption. The capacitance produced in the PIN photodiode formed by the junction between the contact layer 18 and the light absorbing layer 16 is proportional to the length L of that junction. Any extra length of the PIN junction contributes excessive capacitance to the detector, which thereby slows its response.

Figure 20:
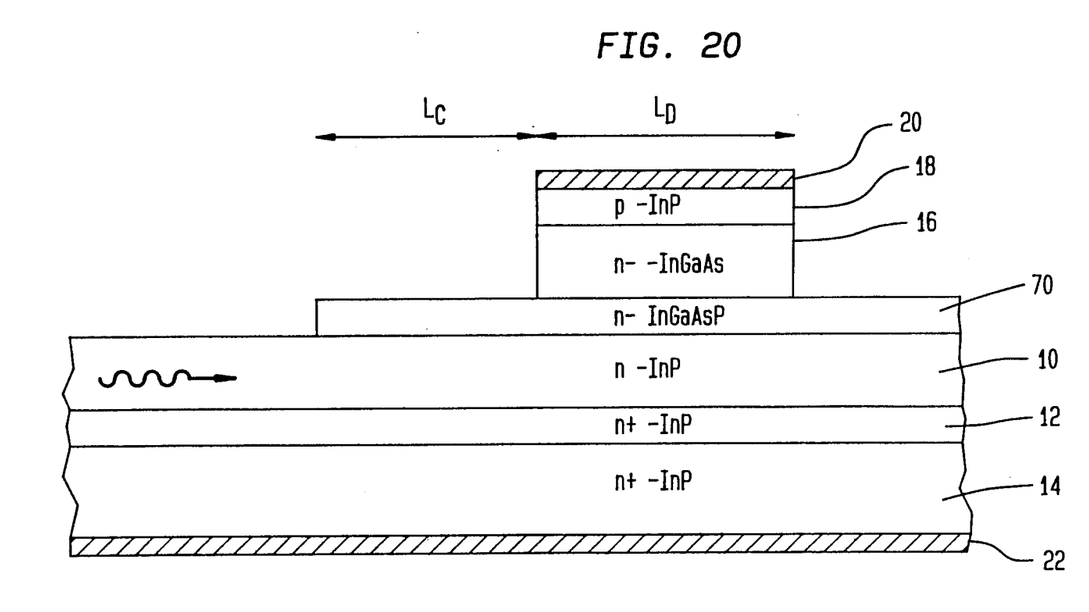
FIG. 20 is a cross-sectional view of a fourth embodiment of the invention.

Another embodiment of the invention, illustrated in the sectional view of FIG. 20 reduces the detector capacitance. The structure is similar to that of FIG. 4. However, the length of the absorbing layer 16 in a first linear portion 68 is $L_D$ while the leading edge of a impedance matching layer 70 extends in a second linear portion 72 for an additional length $L_C$, which is of the order of 10 to 200 μm, toward the source of the propagating light. The location of the trailing edge of the impedance matching layer 70 is not critical. The additional length $L_C$ allows coupling or light propagating along the waveguide layer 10 into the impedance matching layer 70 without the addition of capacitance to the PIN junction between the contact layer 18 and the light absorbing layer 16.

In the present invention, the thickness and refractive index of the impedance matching layer are selected to such values so as to substantially decrease the reflection of light associated with the waveguide light which is incident towards the light absorbing layer.

Also, in the present invention, the light absorbing layer may be formed of a semiconductor layer of a first conductivity type and a contact layer disposed on the light absorbing layer is formed of a semiconductor layer of a second conductivity type opposite to the first conductivity type. Additional contact electrodes are formed for applying a bias voltage between the light absorbing layer and the contact layer.

In the present invention, a cladding region having a refractive index smaller than that of the optical waveguide layer may be provided as a layer in contact with the optical waveguide layer on its upper or lower side and extending along the optical waveguide layer.

In the present invention, the optical waveguide layer and/or the cladding region may be a multiple quantum well region formed by alternately stacking a pair of semiconductor layers of different materials.

In the present invention, the impedance matching layer may be formed of a plurality of layers having different refractive indices.

Moreover, in the present invention, the impedance matching layer may have a periodic structure of a repeating pair of layers of different refractive indices. Furthermore, the impedance matching layer may have a continuously varying composition such that the index of refraction is linearly graded between the optical waveguide layer and the light absorbing layer.

In the present invention, the impedance matching layer provided between the optical waveguide layer and the light absorbing layer has the function similar to that of an anti-reflection coating and therefore the optical wave propagating through the optical waveguide layer passes to the side of light absorbing layer almost without reflection of the waveguided light rays at the boundary between the optical waveguide layer and the light absorbing layer. Accordingly, light coupling efficiency can be improved and the light absorbing coefficient can thereby be enhanced. As described above, the impedance matching layer has the function of transferring the optical power propagating through the optical waveguide layer to the side of the light absorbing layer without any reflection. Namely, the layer in question is called the impedance matching layer in the present invention because it has a function of impedance matching, similar to that of a transformer used in a transmission line in an electrical circuit.

The thickness and refractive index of the impedance matching layer of the present invention may be selected to their respective optimum values so that it functions similar to an anti-reflection layer.

The present invention is capable of increasing the light absorption coefficient by forming an impedance matching layer having an intermediate refractive index between those of the optical waveguide layer and of the light absorbing layer. The absorption becomes more than that when such a layer is not provided. Therefore, a high optical coupling coefficient can be ensured for the optical waveguide layer and light absorbing layer even in case the refractive index and thickness of the optical waveguide layer are selected to the optimum value from the point of view of efficient coupling for the optical fiber and the thickness and length of light absorbing layer are selected to the optimum values from the point of view of high-speed operational characteristics of the photodiode. Namely, a high light absorption coefficient can be attained.

Moreover, the impedance matching layer can be given the function similar to that of the anti-reflection film and further improves the light absorption coefficient by selecting the thickness and refractive index of the impedance matching layer to the optimum values.

What is claimed is:

1. An impedance-matched optical detector, comprising:
   a substrate;
   an optical waveguide layer linearly extending along a surface of said substrate and having a first refractive index for propagating therein light of a predetermined wavelength parallel to said surface;
   a light absorbing layer for absorbing said light of said predetermined wavelength and thereby providing an electrical signal for said detector, said light absorbing layer being formed adjacent to a first linear portion of said optical waveguide layer and having a second refractive index different from said first refractive index;
   an impedance matching region formed between said waveguide layer and said light absorbing layer adjacent within an optical intensity distribution to only a second linear portion of said optical waveguide layer and having a third refractive index between said first and second refractive indices, said third refractive index being averaged over said impedance matching region; and
   cladding media disposed immediately above and below said optical waveguide layer at least in linear portions away from said first and second linear portions, said cladding media having respective refractive indices smaller than said first refractive index and respective thicknesses larger than corresponding optical intensity distributions in said cladding media.

2. An impedance-matched detector as recited in claim 1, wherein said cladding media comprise a cladding layer adjacent to optical waveguide layer in said first and second linear portions on a side facing said impedance matching region.

3. An impedance-matched detector as recited in claim 1, wherein said impedance matching region is immediately adjacent said waveguide layer and said light absorbing layer.

4. An impedance-matched detector as recited in claim 3, wherein said impedance matching region and said light absorbing layer are disposed on a side of said optical waveguide layer opposite said substrate.

5. An impedance-matched detector as recited in claim 3, wherein a free surface forms an upper one of said cladding media in a third linear portion of said optical waveguide layer disposed away from said first and second linear portions.

6. An impedance-matched detector as recited in claim 3, wherein said impedance matching region comprises a region of varying refractive index.

7. An impedance-matched detector as recited in claim 6, wherein said impedance matching region comprises a region of continuously varying refractive index.

8. An impedance-matched detector as recited in claim 1, wherein said optical waveguide layer comprises a semiconductor material.

9. An impedance-matched detector as recited in claim 6, wherein said impedance matching region comprises a plurality of pairs of layers of different refractive indices.

10. An impedance-matched optical detector, comprising:
   a substrate;
   a waveguide structure including a core region formed in an upper surface of said substrate and extending therealong, said core region having a first index of refraction;
   an impedance matching region formed over a first area of said core region and having a second index of refraction, said second index of refraction being averaged over said impedance matching region; and
   a light absorbing layer formed over a second area of said impedance matching region and having a third index of refraction, said second index having a value intermediately between values of said first and third indices, said light absorbing layer generating an electrical signal for said detector.

11. An impedance-matched detector as recited in claim 10, wherein said light absorbing layer comprises a semiconductor of a first conductivity type.

12. An impedance-matched detector as recited in claim 11, further comprising a contact layer formed over said light absorbing layer and comprising a semiconductor of a second conductivity type.

13. An impedance-matched detector as recited in claim 10, wherein said first area extends substantially closer a side from which light propagates in said waveguide structure than does said second area.

14. An impedance-matched detector as recited in claim 10, wherein said impedance matching region has a non-uniform composition.

15. An impedance-matched detector as recited in claim 14, wherein said impedance matching region comprises at least one quantum well layer.

16. An impedance-matched detector as recited in claim 14, wherein said impedance matching region comprises a superlattice.

17. An impedance-matched detector as recited in claim 14, wherein said impedance matching region comprises a layer of graded composition.

18. An impedance-matched detector as recited in claim 10, wherein said impedance matching region is formed immediately adjacent said light absorbing layer and said core region.

19. An impedance-matched detector as recited in claim 10, wherein said core region comprises a semiconductor material.

* * * * *